United States Patent [19]
Yun

[11] Patent Number: 6,166,970
[45] Date of Patent: Dec. 26, 2000

[54] PRIORITY DETERMINING APPARATUS USING THE LEAST SIGNIFICANT BIT AND CAS LATENCY SIGNAL IN DDR SDRAM DEVICE

[75] Inventor: Mi-Kyung Yun, Ichon, Rep. of Korea

[73] Assignee: Hyundai Electronics Industries Co., Ltd., Rep. of Korea

[21] Appl. No.: 09/475,260

[22] Filed: Dec. 30, 1999

[30] Foreign Application Priority Data

Dec. 30, 1998 [KR] Rep. of Korea ................... 98-61090

[51] Int. Cl.[7] .................................................. G11C 7/00
[52] U.S. Cl. .................. 365/191; 365/189.05; 365/194; 711/151; 711/158
[58] Field of Search ............................... 365/191, 189.05, 365/194, 230.06; 711/151, 158

[56] References Cited

U.S. PATENT DOCUMENTS 5,809,278  9/1998  Watanabe et al. ................... 711/151
5,809,539  9/1998  Sakakibara et al. .................. 711/158
6,079,001  6/2000  Le et al. ............................ 365/230.06

*Primary Examiner*—Tan T. Nguyen
*Attorney, Agent, or Firm*—Blakely Sokoloff Taylor & Zafman

[57] ABSTRACT

Disclosed is a DDR SDRAM device capable of inputting and outputting a plurality of data within one period of a clock; and, more particularly, a priority determining apparatus for determining data output priority between even and odd data. The DDR SDRAM device according to the present invention includes a priority signal generator for receiving a least significant bit of a column address signal and a first control signal which is activated when read or write operation is carried out and for generating a priority signal to determine an order of output of the even and odd data stored in each of the pipeline latch circuits.

7 Claims, 1 Drawing Sheet

PRIORITY DETERMINING APPARATUS USING THE LEAST SIGNIFICANT BIT AND CAS LATENCY SIGNAL IN DDR SDRAM DEVICE

FIELD OF THE INVENTION

The present invention relates to a DDR SDRAM device capable of inputting and outputting a plurality of data within one period of a clock; and, more particularly, to a priority determining apparatus for determining data output priority between even and odd data.

DESCRIPTION OF THE PRIOR ART

With the increase of data output bandwidth in semiconductor memory devices, the DDR (Double Data Rate) method of outputting double data at rising and falling edges of a clock signal has been required instead of the SDR (Single Data Rate) method of outputting data only at a rising edge. In implementing data input/output circuits in the DDR method, it is very difficult to double the operation speed in a memory core because the memory core does not have an operation timing margin enough. Accordingly, it is inevitable to take such a double data input/output in a two-bit prefetch method. Generally, the operation speed of the memory core in the two-bit prefetch method is the same as that in the SDR (Single Data Rate) method, but the two-bit prefetch method in such as a DDR method puts double data in a latch circuit, and processes each data at the rising and falling edges of a clock signal. In other words, when the data stored in memory cells are read out, the pipe counter determines the order of the data output before outputting the data through an output buffer.

Since two data (even data and odd data) according to a column addresses are prefetched, the first of them must be determined. Especially, in the conventional DDR SDRAM device, since two data for a column address are read out, the least significant bit is not used and the determination of output order of even or odd data is performed by an appropriate timing. However, this timing control requires complicated circuits and an exact data output can not be guaranteed.

SUMMARY OF THE INVENTION

It is, therefore, an object of the present invention to provide a DDR SDRAM device capable of improving an accuracy of read operation.

It is another abject of the present invention to provide a DDR SDRAM device carrying out an exact read operation using the least significant bit of a column address signal.

In accordance with another aspect of the present invention, there is provided a DDR SDRAM device having pipeline latch circuits storing even data and odd data, the DDR SDRAM device comprising a priority signal generating means for receiving a least significant bit of a column address signal and a first control signal which is activated when read or write operation is carried out and for generating a priority signal to determine an order of output of the even and odd data stored in each of the pipeline latch circuits.

Further, the DDR SDRAM device according to the present invention comprises a plurality of control signal generators coupled to the priority signal generating means for generating second control signals and the second control signals control the pipeline latch circuits at the read or write operation in response to a rising or falling edge signal of a clock signal and a CAS latency signal, whereby the priority signal controls the order of output of the even and odd data stored in each of the pipeline latch circuits and the second control signals control an order of output of the pipeline latch circuits.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
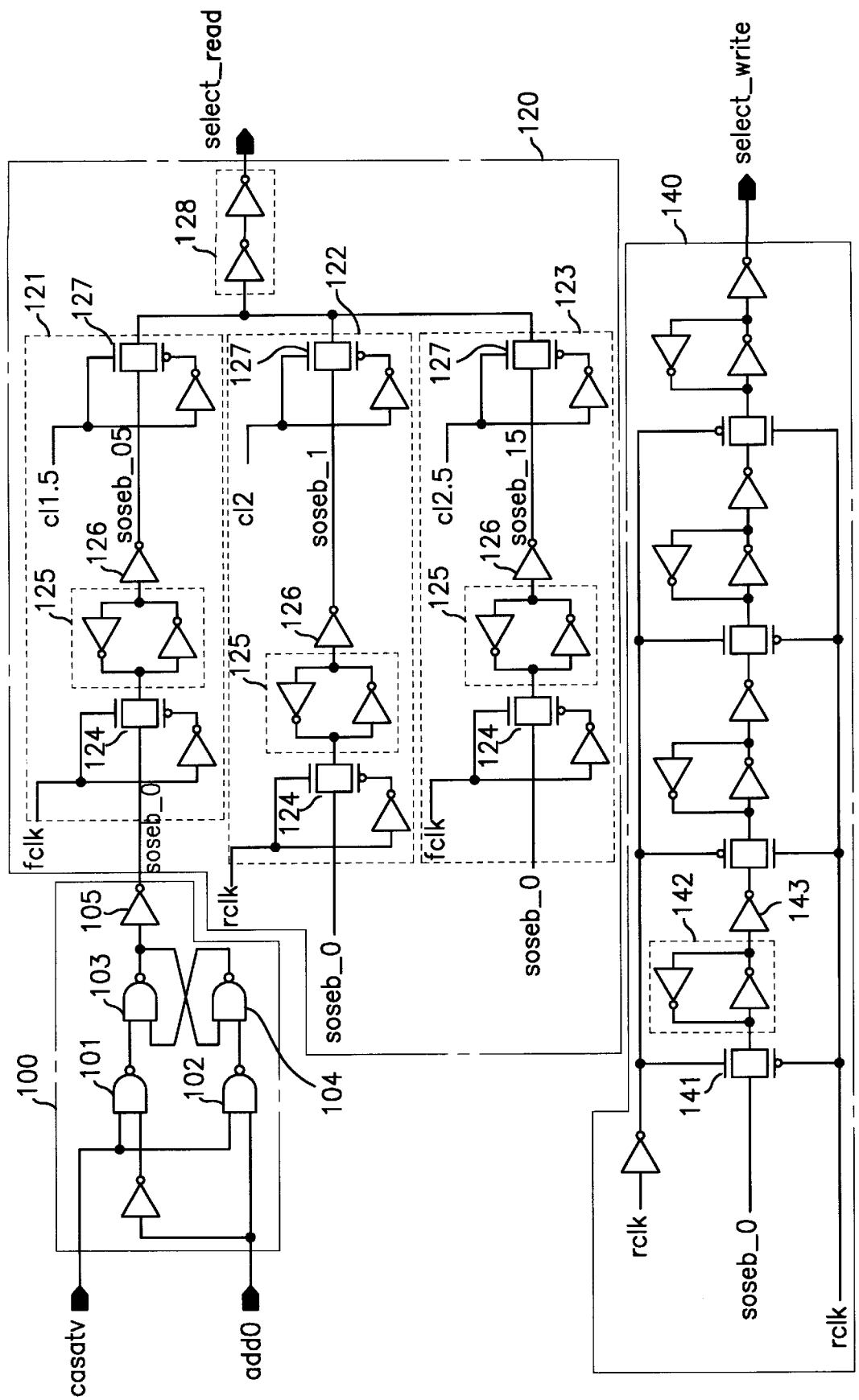
FIG. 1 is a schematic block diagram illustrating a priority determining apparatus determining an order of data output according to the present invention.

Hereinafter, a priority determining apparatus according to the present invention will be described in detail referring to FIG. 1.

First, the priority determining apparatus according to the present invention includes a signal generating unit 100, a read data priority selection unit 120 and a write data selection unit 140. The signal generating unit 100 generates a priority signal soseb_0 indicating even or an odd of a start address in response to a CAS (Column Access Strobe) activation signal casatv, which is activated in a logic high level when the least significant bit add0 of a column address signal and a CAS (Column Access Strobe) activation signal casatv associated with a data read/write command are input. The read data priority selection unit 120 receives the priority signal soseb_0 from the signal generating unit 100 and generates a read data priority selection signal select_read for controlling pipeline latch circuits in response to rising and falling edge signals rclk and fclk of a clock signal and CAS latency signals cl1.5, cl2 and cl2.5. Also, the write data selection unit 140 receives the priority signal soseb_0 from the signal generating unit 100 and generates a write data selection signal select_write in response to the rising edge signal of the clock signal rclk.

The signal generating unit 100 includes: 1) a NAND gate 101 receiving the CAS (Column Access Strobe) activation signal casatv and an inverted least significant bit add0; 2) a NAND gate 102 receiving the CAS (Column Access Strobe) activation signal casatv and the least significant bit add0; 3) a NAND gate 103 receiving an output from the NAND gate 101; 4) a NAND gate 104 receiving outputs from the NAND gates 102 and 103 and outputting an output into the NAND gate 103; and 5) an inverter 105 inventing an output from the NAND gate 103 and outputting the priority signal soseb_0. When data read or write command is input so that the CAS activation signal casatv is activated in a logic high level, the signal generating unit 100 takes the least significant bit as the priority signal soseb_0, and when the CAS activation signal casatv is activated in a logic low level, the signal generating unit 100 maintains the previous priority signal soseb_0.

The read data priority selection unit 120 includes a selection unit 121 taking the priority signal soseb_0 from the signal generating unit 100 as the read data priority selection signal select_read in response to the falling edge signal fclk and the CAS latency signal cl1.5, a selection unit 122 taking the priority signal soseb_0 from the signal generating unit 100 as the read data priority selection signal select_read in response to the rising edge signal rclk and the CAS latency signal cl2, and a selection unit 123 taking the priority signal soseb_0 from the signal generating unit 100 as the read data priority selection signal select_read in response to the falling edge signal fclk and the CAS latency signal cl2.5.

The selection unit 121 includes a latch circuit 125 latching the priority signal soseb_0 from the signal generating unit 100, a first transmission gate 124 transferring the priority signal soseb_0 to the latch circuit 125 in response to the falling edge signal fclk, an inverter 126 coupled to the latch circuit 125 for inverting the priority signal soseb_0 and for outputting an inverted priority signal soseb_05, a delay unit 128 delaying the inverted priority signal soseb_05, and a transmission gate 127 transferring the inverted priority signal soseb_05 to the delay unit 128 in response to the CAS latency signal cl1.5. The selection unit 122 includes a latch circuit 125 latching the priority signal soseb_0 from the signal generating unit 100, a first transmission gate 124 transferring the priority signal soseb_0 to the latch circuit 125 in response to the rising edge signal rclk, an inverter 126 coupled to the latch circuit 125 for inverting the priority signal soseb_0 and for outputting an inverted priority signal soseb_1, a delay unit 128 delaying the inverted priority signal soseb_1, and a transmission gate 127 transferring the inverted priority signal soseb_1 to the delay unit 128 in response to the CAS latency signal cl2. Likewise, the selection unit 123 includes a latch circuit 125 latching the priority signal soseb_0 from the signal generating unit 100, a first transmission gate 124 transferring the priority signal soseb_0 to the latch circuit 125 in response to the rising edge signal rclk, an inverter 126 coupled to the latch circuit 125 for inverting the priority signal soseb_0 and for outputting an inverted priority signal soseb_15, a delay unit 128 delaying the inverted priority signal soseb_15, and a transmission gate 127 transferring the inverted priority signal soseb_15 to the delay unit 128 in response to the CAS latency signal cl2.5.

The write data selection unit 140 generating a write data selection signal select_write includes a plurality of stages (four stages in a preferred embodiment). Each stage latches the priority signal soseb_0 in response to the rising edge signal rclk, having a transmission gate 141 transferring the priority signal soseb_0 to a latch circuit 142 storing the transferred priority signal soseb_0 in response to the rising edge signal rclk and an inverter 143 inverting the latched priority signal soseb_0.

When the CAS clock signals are toggled, the CAS activation signal casatv to indicate read or write operation and the least significant bit add0 of the column address signal to indicate even or odd data are input into the signal generating unit 100. At this time, when both the CAS activation signal casatv and the least significant bit add0 are in a logic high level, the priority signal soseb_0 is in a logic high level. When the CAS activation signal casatv is in a logic high level and the least significant bit add0 is in a logic low level, the priority signal soseb_0 is in a logic low level. The logic level of the priority signal soseb_0 is determined according to the high or low value of the least significant bit add0. For example, if the priority signal soseb_0 is in a logic high level, even data may be read out, and if the priority signal soseb_0 is in a logic low level, odd data may be read out. In a read operation, the timing of the read data priority selection signal select_read is determined by the CAS latency signal. That is, when the CAS activation signal casatv is activated, the signal generating unit 100 receives the least significant bit add0 and generates the priority signal soseb_0.

Also, the selection units 121 to 123 in the read data priority selection unit 120 outputs the priority signals soseb_05, soseb_1 and soseb_15 in response to the falling edge signal fclk, the rising edge signal fclk and the next falling edge signal fclk, respectively. These the priority signals soseb_05, soseb_1 and soseb_15 generated in the selection units 121 to 123 are output in response to the CAS latency signals cl1.5, cl2 and cl2.5, respectively. As a result, the CAS latency signals cl1.5 and cl2.5 are used for outputting the read data priority selection signal select_read at the falling edge signal fclk and the CAS latency signals cl2 is used for outputting the read data priority selection signal select_read at the rising edge signal fclk.

On the other had, the four stages in the write data selection unit 140 produces the write data selection signal select_write, by delaying the priority signals soseb_0 selects for two clocks through the four stages, regardless of the CAS latency signal.

As apparent from the above, the priority determining apparatus according to the present invention performs an exact read operation, by using rising and falling edge signals and the CAS latency signal. This exact read operation improves the reliability of memory devices, especially in DDR SDRAM memory devices reading out two data for one period of a clock signal.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. A DDR SDRAM device having pipeline latch circuits storing even data and odd data, the DDR SDRAM device comprising:

a priority signal generating means for receiving a least significant bit of a column address signal and a first control signal which is activated when read or write operation is carried out and for generating a priority signal to determine an order of output of the even and odd data stored in each of the pipeline latch circuits.

2. The DDR SDRAM device as recited in claim 1, further comprising a plurality of control signal generators coupled to the priority signal generating means for generating second control signals, wherein the second control signals control the pipeline latch circuits at the read or write operation in response to a rising or falling edge signal of a clock signal and a CAS latency signal, whereby the priority signal controls the order of output of the even and odd data stored in each of the pipeline latch circuits and the second control signals control an order of output of the pipeline latch circuits.

3. The DDR SDRAM device as recited in claim 1, wherein the priority signal generating means comprises a first logic circuit for NANDing the first control signal and an inverted least significant bit;

a second logic circuit for NANDing the first control signal and the least significant bit;

a third logic circuit for receiving an output from the first logic circuit through a first input terminal thereof;

a fourth logic circuit for NANDing outputs from the second and third logic circuits, wherein the third logic circuit receives an output from the fourth logic circuit for NANDing the outputs from the first and fourth logic circuits; and an inverting means for inventing the output from the third logic circuit.

4. The DDR SDRAM device as recited in claim 3, wherein the first control signal is a CAS activation signal.

5. The DDR SDRAM device as recited in claim 1, further comprising a control signal generator coupled to the priority signal generating means for generating a second control signal controlling the pipeline latch circuit at the write operation in response to a rising or falling edge signal.

6. The DDR SDRAM device as recited in claim 5, wherein the second control signal is produced by delaying the priority signal.

7. The DDR SDRAM device as recited in claim 2, wherein the control signal generator comprises:

a latch circuit for latching the priority signal from the priority signal generating means;

a first switching means for transferring the priority signal to the latch circuit in response to the rising or falling edge signal;

an inverting means coupled to the latch circuit for inverting the priority signal;

a delay means for delaying the inverted priority signal; and a second switching means for transferring the inverted priority signal to the delay means in response to the CAS latency signal.

* * * * *